United States Patent [19]
Kilian

[11] Patent Number: 5,206,603
[45] Date of Patent: Apr. 27, 1993

[54] CIRCUIT ARRANGEMENT WITH ELECTRONICALLY CONTROLLABLE TRANSFER CHARACTERISTIC

[75] Inventor: Ernst-August Kilian, Hamburg, Fed. Rep. of Germany

[73] Assignee: U.S. Philips Corporation, New York, N.Y.

[21] Appl. No.: 697,846

[22] Filed: May 9, 1991

[30] Foreign Application Priority Data

May 10, 1990 [DE] Fed. Rep. of Germany ....... 4015019

[51] Int. Cl.[5] ............................................. H03F 1/34
[52] U.S. Cl. ..................................... 330/107; 330/86; 330/282; 330/294
[58] Field of Search ................... 330/51, 86, 107, 109, 330/294, 304, 305; 333/28 R, 28 T; 381/98, 101, 102, 103; 455/267

[56] References Cited

U.S. PATENT DOCUMENTS

4,439,739  3/1984  Kilian et al. ...................... 330/86 X

*Primary Examiner*—James B. Mullins
*Attorney, Agent, or Firm*—Bernard Franzblau

[57] ABSTRACT

In a circuit arrangement with a electronically controllable transfer characteristic, the input signal is applied to an amplifier with a controllable negative feedback. The amplifier has its output connected to a voltage-divider circuit having a frequency-dependent characteristic. This circuit has a plurality of taps (9 to 13, 31 to 35) which are connected to an inverting input of the amplifier via a first electronically controllable switch (8) and to the output of the arrangement via a second electronically controllable switch (30). The two switches (8, 30) are controlled in a manner so as to influence the Q-factors of different filter curves. Therefore, in order to boost the input signal in a frequency band determined by the frequency-dependent voltage divider, the first switch (8) is set a position such that boosting is effected with the desired frequency bandwidth. Furthermore, the position of the second switch (30) is selected so as to obtain boosting to the desired degree. For attenuating the input signal in the frequency band determined by the frequency-dependent voltage divider, the second switch (30) is set a position such that attenuation is effected with the desired frequency bandwidth, and the first switch (8) is set to such a position as to obtain the desired degree of attenuation.

16 Claims, 4 Drawing Sheets

CIRCUIT ARRANGEMENT WITH ELECTRONICALLY CONTROLLABLE TRANSFER CHARACTERISTIC

BACKGROUND OF THE INVENTION

This invention relates to a circuit arrangement with an electronically controllable transfer characteristic, in particular a control circuit, in which an amplifier with controllable negative feedback is capable of receiving an input signal, which amplifier has an output connected to a voltage-divider circuit with a frequency-dependent characteristic, which circuit has a plurality of taps connected to an inverting input of the amplifier via a first electronically controllable switch and to an output of the arrangement via a second electronically controllable switch.

Such a circuit arrangement is known from German Patent Specification 31 32 402, which corresponds to U.S. Pat. No. 4,439,739 (Mar. 27, 1984). In this prior-art arrangement the frequency response to the input signal is influenced by suitably controlling the two electronically controllable switches. The two switches are controlled in a manner such that for a boost of the input signal in a frequency band determined by the frequency-dependent voltage divider, the second switch is set to that position in which the signal of the highest level is coupled out. The degree of boosting is changed by setting the first switch to its various positions. Conversely, the frequency range is attenuated in that the first switch is set to the position for maximum negative feedback and the second switch is actuated between its various positions. Particularly when used in a frequency-dependent configuration for, for example, equalizers or tone controls, this circuit arrangement has the drawback that depending on the selected boost or attenuation always a specific frequency band of the same width is influenced. Only the degree of boosting or attenuation is changed. Put in different terms, this means that for comparatively small boosts or attenuations the filtering provided by the circuit arrangement exhibits a smaller Q-factor than for stronger boosts or attenuations in the relevant frequency band. Here, the Q-factor is to be understood to mean the ratio of the frequency at the maximum boost or attenuation to the frequency difference between the frequencies for which the boost or attenuation is 3 dB below the maximum value.

SUMMARY OF THE INVENTION

It is an object of the invention to provide a circuit arrangement which is capable of producing comparatively small boosts or attenuations with the same filter quality as larger boosts or attenuations.

According to the invention this object is achieved in that the two switches are controlled in a manner such that
for boosting the input signal in a frequency band determined by the frequency-dependent voltage divider
the first switch is set a position such that boosting is effected with the desired frequency bandwidth, and that
the position of the second switch is selected so as to obtain boosting to the desired degree, and that
for attenuating the input signal in the frequency band determined by the frequency-dependent voltage divider the second switch is set to a position such that attenuation is effected with the desired frequency bandwidth, and that
the first switch is set a position so as to obtain attenuation to the desired degree.

The invention is based on the recognition of the fact that for boosting the input signal in the frequency range determined by the frequency-dependent voltage divider, the Q-factor of the filter curve then produced by the circuit arrangement depends on the position of the first switch, i.e. on the degree of negative feedback from the output to the inverting input of the amplifier. Thus, the quality of the resulting filter curve, i.e. the frequency bandwidth in which the input signal is boosted, can be influenced by an appropriate setting of the first switch. Conversely, the degree of boosting is influenced by setting the second switch to an appropriate position. When the input signal in the relevant frequency band is boosted, the various positions of the second switch do not influence the Q-factor of the resulting filter curves. This means that the position of the first switch dictates the quality of the resulting filter curves, the degree of boosting being determined by an appropriate control of the second switch.

To attenuate the input signal in the frequency band the situation is exactly the other way around because now the Q-factor of the resulting filter curves is determined by the position of the second switch. Thus, the second switch must be set to such a position that the attenuation is obtained with the desired frequency bandwidth and Q-factor. The degree of attenuation is now defined by setting the first switch to an appropriate position.

In many cases it will be desirable to have a boost or attenuation with a constant Q-factor in the frequency band even when the degree of boosting or attenuation varies. In the case of boosting this means that the first switch is set to a fixed position which results in a boost in the desired frequency band or with the desired Q-factor. The degree of boosting is then influenced by an appropriate setting of the second switch, the first switch remaining in the same position. The same applies to the attenuation for which the quality factor is selected by setting the second switch to a position which is subsequently maintained and for which the attenuation degree is selected by an appropriate setting of the first switch.

Thus, by an appropriate setting of the switches the circuit arrangement in accordance with the invention not only allows the degree of boosting but also the width of the influenced frequency band to be influenced, i.e. the Q-factor of the resulting filter curves. In particular, in the present circuit arrangement, for comparatively small boosts or attenuations of the input signal within the frequency band, the Q-factor of the filter curves no longer exhibit comparatively small values.

In an embodiment of the invention for boosting the input signal in the frequency band, the first switch is set to the position for minimum negative feedback, and for attenuating the input signal in the frequency band the second switch is set to that position in which the maximal attenuation of the output signal is obtained.

As in many fields of use the frequency band to be influenced should be as narrow as possible, particularly also in the case of comparatively small boosts or attenuations, it is advantageous for these cases to set the switches in such a way that the maximum attainable Q-factor of the resulting filter curves is obtained when the frequency range is influenced differently. For boosts of the input signals in the frequency range this is effected in that the first switch is set to the position for minimum negative feedback because in this position filter curves with maximal Q-factor are produced for a boost of the input signal. Conversely, for the attenuation of the input signal the second switch is set to that position for which this switch provides the maximum attenuation of the output signal. In the case of attenuation of the input signal this position of the second switch provides the maximum Q-factor of the filter curves.

This embodiment is particularly advantageous in those cases in which a frequency band of minimal width should also be influenced when only minimal boosts or attenuations are required, as in the case of, for example, equalizers.

In a further embodiment of the invention the switches are semiconductor circuits whose switching states can be controlled by digital data words. This simply enables both the Q-factor of the resulting filter curves, i.e. the width of the frequency band being influenced, and the desired degree of boosting or attenuation to be adjusted in a simple manner.

In a further embodiment of the invention a plurality of circuit arrangements with electronically controllable transfer characteristic are arranged after one another to influence the input signal in different frequency bands.

In this way it is comparatively easy to construct an equalizer which has the special advantage that even comparatively small changes of the frequency response can be obtained with the same Q-factor as larger changes of the frequency response.

BRIEF DESCRIPTION OF THE DRAWING

An embodiment of the circuit arrangement in accordance with the invention will now be described in more detail with reference to the drawings. In the drawings.

DESCRIPTION OF THE PREFERRED EMBODIMENTS

Figure 1:
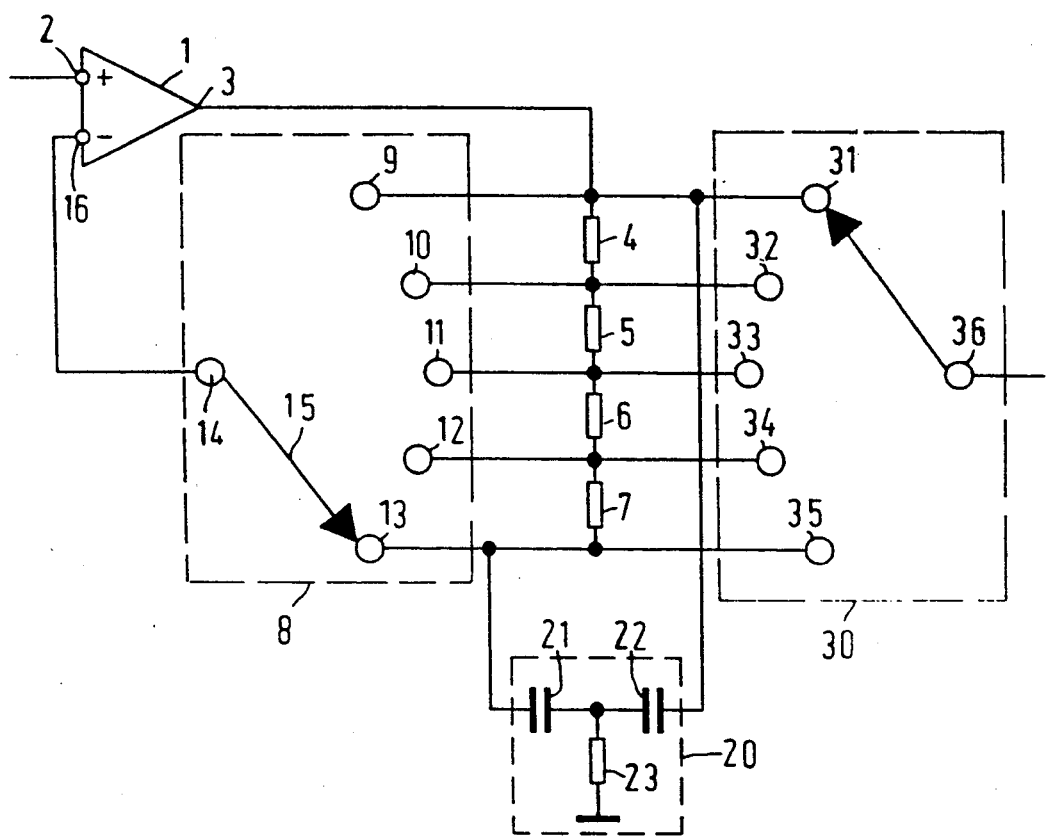
FIG. 1 is a basic diagram of a circuit arrangement with electronically controllable transfer characteristic.

FIG. 1 shows a circuit arrangement in accordance with the invention which enables its input signal to be influenced within a specific frequency band. Such a circuit arrangement is particularly suitable for use in audio equipment, if desired as a plurality of such arrangements arranged one after another to influence different frequency bands.

The circuit arrangement shown in FIG. 1 comprises an operational amplifier 1 whose non-inverting input 2 receives the input signal to be influenced. An output 3 of the operational amplifier 1 is connected to a resistor chain comprising a series arrangement of resistors 4, 5, 6 and 7.

There has also been provided an electronically controllable switch 8 having five input terminals 9, 10, 11, 12, 13 and one output terminal 14. In the Figure the switch is shown diagrammatically as a pointer 15 by means of which one of the inputs 9 to 13 is connected to the output 14. In practice, the switch 8 is an electronic switch, which can be controlled, for example, externally by appropriate data words in a manner not shown.

The first input 9 of the electronic switch 8 is connected to the output 3 of the operational amplifier 1. The second input 10 of the switch 8 is connected to the node between the resistors 4 and 5, the third input 11 is connected to the node between the resistors 5 and 6, the fourth input 12 is connected to the node between the resistors 6 and 7, and the fifth input 13 of the switch 8 is connected to the end of the resistor chain. The output 14 of the first switch 8 is connected to an inverting input 16 of the operational amplifier 1. The negative feedback of the operational amplifier 1 is adjustable in accordance with the selected input 9 to 13 of the first switch 8.

A frequency-dependent circuit element 20 is connected in parallel with the resistor chain comprising the resistors 4 to 7. This circuit element comprises two series-connected capacitors 21 and 22 whose node is connected to ground via a resistor 23. The resistor chain, which comprises the resistors 4 to 7, and the circuit element 20 constitute the frequency-dependent voltage-divider circuit. In the example shown in FIG. 1 this voltage divider circuit has been dimensioned to influence the input signal in a frequency band around 1 kHz.

There has further been provided a second electronically controllable switch 30 which in the same way as the first switch 8 is shown only diagrammatically in FIG. 1 and which comprises five inputs 31, 32, 33, 34 and 35. The input 31 of the second switch 30 is arranged in the same way as the input 9 of the first switch 8. Likewise, the further inputs 32 to 35 are arranged similarly to the inputs 10 to 13 of the first switch 8. The inputs 31 to 35 of the second electronically controllable switch 30 can be connected to its output 36. The output level of the output signal of the arrangement appearing on the output 36 of the second switch 30 is adjustable by means of the second switch 30.

The circuit arrangement shown in FIG. 1 enables the input signal applied to the non-inverting input 2 of the operational amplifier 1 to be boosted or attenuated depending on the control of the two electronic switches 8 and 30. The corresponding output signal is made available on the output 36 of the second switch 30.

If the input signal is to be boosted in the frequency band determined by the frequency-dependent voltage divider, the width of the frequency band in which boosting is effected is influenced by the position of the first electronic switch 8. However, the degree of boosting is influenced by the position of the second electronic switch 30. Conversely, if the input signal is to be attenuated in the frequency band determined by the voltage divider, the width of the frequency band to be influenced is determined by the position of the second switch 30 and the degree of attenuation is influenced by the position of the first electronic switch 8.

The operation of the circuit arrangement shown in FIG. 1 will now be explained with reference to the frequency diagram shown in FIG. 2.

It is assumed hereinafter that the frequency-dependent voltage divider circuit comprising the chain of resistors 4 to 7 and the frequency-dependent circuit element 20 influences the frequency response of the input signal in the band around 1 kHz, the maximum influence being obtained at 1 kHz.

Figure 2:
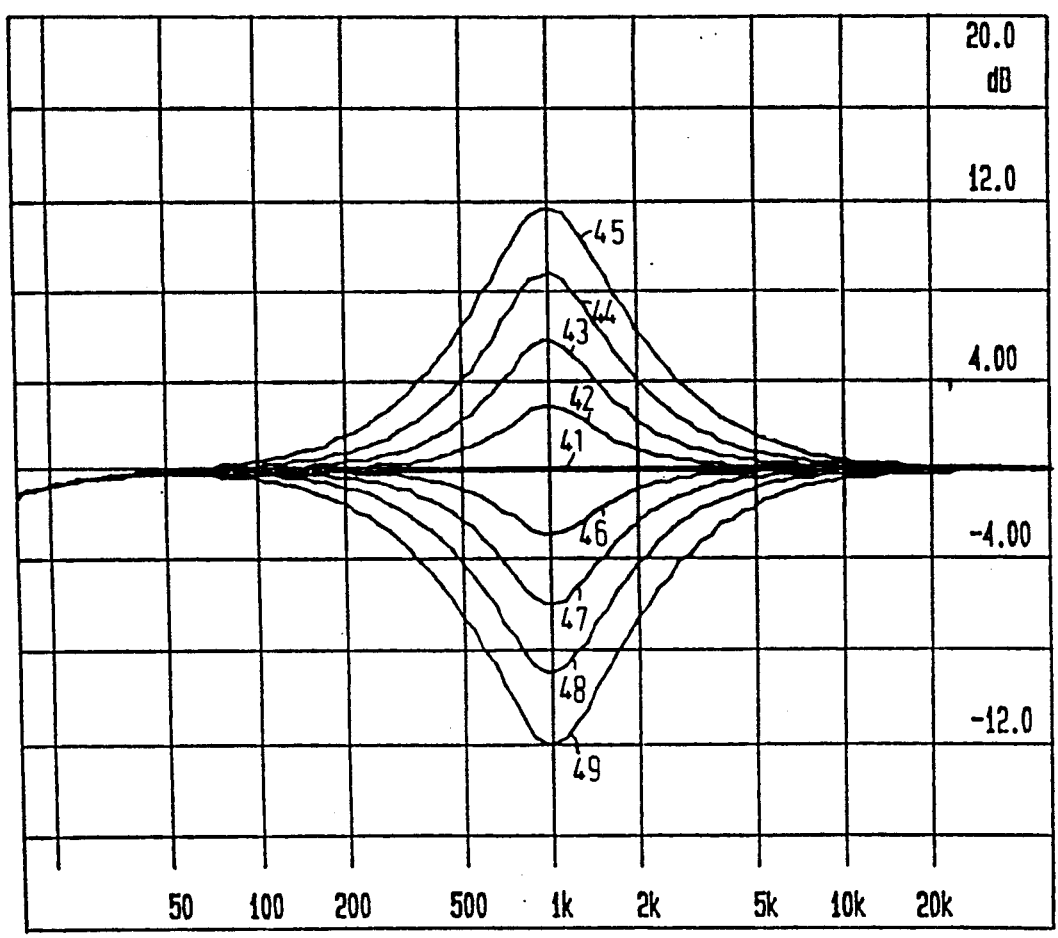
FIG. 2 shows various filter curves of the circuit arrangement shown in FIG. 1 with a constant Q-factor.

FIG. 2 shows a family of curves representing the output signal of the circuit arrangement in the case of a linear input signal for different positions of the switches 8 and 30. In the example shown in FIG. 2 the circuit arrangement shown in FIG. 1, i.e. its electronically controllable switches 8 and 30, is controlled in such a way that also for small boosts or attenuations of the input signal in the frequency band around 1 kHz filter curves with substantially the same quality factor are obtained as for stronger boosts or attenuations.

For the curve 41 shown in FIG. 2, when the input signal appears substantially unchanged on the output of the circuit arrangement, the first electronic switch 8 has been switched to its input 13 and the second electronic switch 30 to its input 35. These positions of the switches 8 and 30 yield a linear frequency response, which is obtained for all those switch positions of the two switches for which the switches are connected to the same node in the resistor chain. Thus, the curve 41 shown in FIG. 2 is also obtained, for example, if the first electronic switch 8 is switched to its input 9 and the second electronic switch 30 to its input 31. In these switch positions the signal does not pass through the frequency-dependent voltage divider circuit and the entire circuit arrangement exhibits a gain of zero dB.

FIG. 2 also shows curves 42 to 45 for which the input signal is boosted in the frequency band around 1 kHz. In the examples shown in FIG. 2 these curves have been selected in such a way that the Q-factor is substantially the same for the filter curves 42 to 45. For this purpose the first electronic switch 8 in the circuit arrangement shown in FIG. 1 is switched to its input 13. The curve 42 shown in FIG. 2 is obtained in that the second electronic switch 30 is switched to its input 34. By switching the second electronic switch 30 from its input 35 to its input 34 the output attenuation is reduced, so that now the output signal is influenced by the frequency-dependence of the voltage divider circuit. If a stronger boost in accordance with the curve 43 in FIG. 2 is required the electronic switch 30 is switched to its input 33. The curve 44 of FIG. 2 is obtained by switching the electronic switch 30 to its input 32 and the curve 45 is obtained by switching this switch to its input 31. The curve 45 represents the maximum boost of the input signal in the frequency band around 1 kHz, which is approximately 12 dB in the example shown in FIG. 2.

Since for an attenuation of the input signal with filter curves of constant Q-factor the position of the second electronic switch 30 should not be changed, the second electronic switch is switched to its input 35 for the family of curves 46 to 49 shown in FIG. 2. The different degrees of attenuation represented by the family of curves 46 to 49 are obtained by appropriately switching the first electronic switch 8. The curve 46 is obtained when the first electronic switch 8 is switched to its input 12. The maximum attenuation of the input signal in the frequency band around 1 kHz in accordance with the curve 49 is obtained when the first electronic switch 8 is switched to its first input 9.

Figure 3:
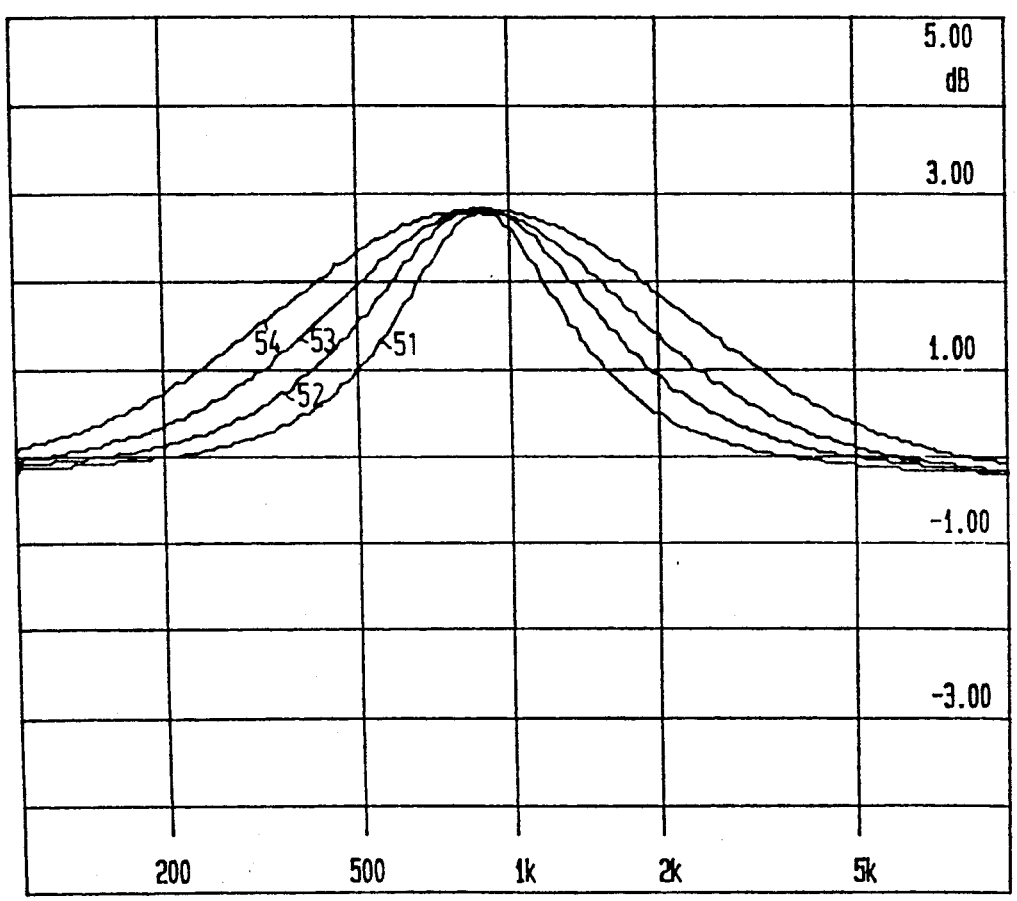
FIG. 3 shows filter curves of the circuit arrangement shown in FIG. 1 with different Q-factors

The example shown in FIG. 2 has been selected in such a way that both a boost and an attenuation of the input signal in the frequency band are always effected with the maximal Q-factor. This will be desirable in, for example, equalizers which should generally influence a frequency band which is as narrow as possible. Since the circuit arrangement in accordance with the invention enables the Q-factor of the filter curve produced by the arrangement to be adjusted selectively, it is possible to obtain filter curves with different Q-factors for a specific degree of boosting or attenuation. FIG. 3 shows some filter curves which can be obtained in such a case by means of the circuit arrangement shown in FIG. 1.

FIG. 3 shows four filter curves 51 to 54 for which the input signal is each time boosted to the same extent, i.e. approximately 3 dB, in the frequency band around 1 kHz. However, this boosting is effected in frequency bands of different widths, i.e. with filter curves having different Q-factors.

The curve 51 shown in FIG. 3 is the curve with the maximum Q-factor, i.e. the curve for which boosting is effected in a comparatively narrow frequency band. In this case the first switch 8 in the circuit arrangement shown in FIG. 1 is switched to its input 13 and the second electronic switch 30 is switched to its input 34. In order to obtain the curve 52 in FIG. 3, the first electronic switch 8 in the circuit arrangement shown in FIG. 1 is switched to its input 12 and the second electronic switch 30 is switched to its input 33. For the curve 53 in FIG. 3 the first electronic switch 8 is switched to its input 11 and the second electronic switch 30 is switched to its input 32. In order to obtain the curve 54 with the smallest Q-factor in FIG. 3, the first electronic switch 8 in the circuit arrangement shown in FIG. 1 is switch to its input 10 and the second electronic switch 30 is switched to its input 31. The family of curves in FIG. 3 shows that the Q-factor of the resulting filter curves, i.e. the width of the influenced frequency band, is influenced by the position of the first switch 8 in the case of a boost of the input signal. This first switch 8 determines the degree of negative feedback in the circuit arrangement and therefore not only the Q-factor of the filter curves but also the gain. For the filter curves in FIG. 3 with the same degree of boosting this different negative feedback and hence the different gain in the circuit arrangement can be compensated for by an appropriate setting of the second switch 30. However, the different positions of the second switch 30 do not influence the Q-factors of the resulting filter curves when the input signal is boosted.

Figure 4:
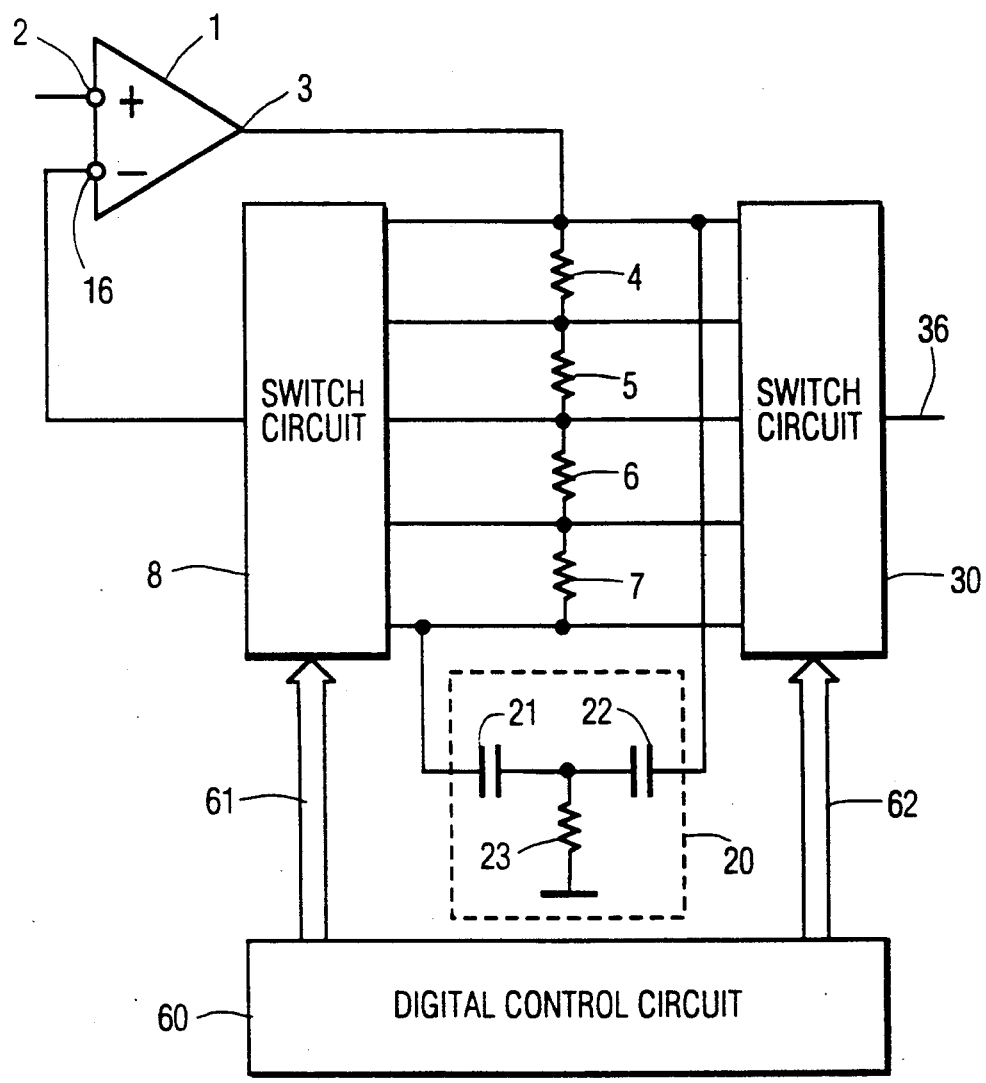
FIG. 4 is a further diagram of a circuit arrangement with electronically controllable transfer characteristic.

In the circuit of FIG. 4, the first and second switches 8 and 30 of FIG. 1 are shown in block form. A digital data control circuit 60 generates a first digital data word 61 and a second digital data word 62 in order to control the switches 8 and 30. The circuit otherwise operates in a manner similar to that described above for the circuit of FIG. 1.

Figure 5:
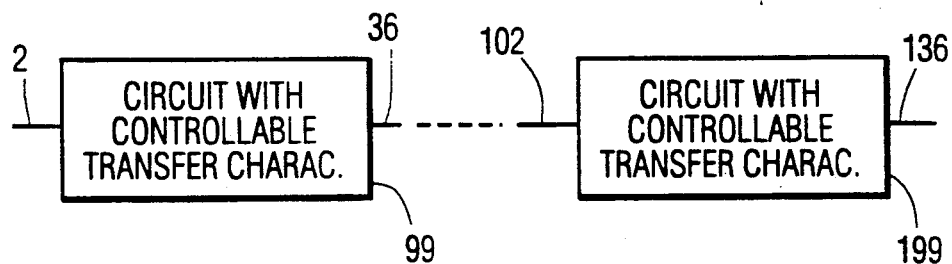
FIG. 5 is a diagram of a plurality of circuit arrangements with electronically controllable transfer characteristics.

FIG. 5 shows a plurality of circuit arrangements each with an electronically controllable transfer characteristic. In FIG. 5, a first circuit arrangement 99 with an electronically controllable transfer characteristic and a last circuit arrangement 199 with an electronically controllable transfer characteristic are shown. These circuit arrangements may be implemented in accordance with the circuit arrangements of FIG. 1 or FIG. 4 and may be part of a plurality of circuit arrangements with electronically controllable transfer characteristics. The first circuit arrangement 99 is provided with an input 2 and an output 36, and the last circuit arrangement 199 is provided with an input 102 and an output 136. When an input signal is supplied to the input 2 and the output 36 is coupled to the input 102, either directly or by means of one or more further such circuit arrangements, an output signal can be obtained from the output 136. The circuit arrangements (99, ... and 199) are thus able to influence the input signal in a plurality of different frequency bands.

I claim:

1. A control circuit with an electronically controllable transfer characteristic, comprising: an amplifier with controllable negative feedback having an input for receiving an input signal, means connecting an output of the amplifier to a voltage-divider circuit having a frequency-dependent characteristic, said voltage-divider circuit having a plurality of taps connected to an inverting input of the amplifier via first electronically controllable switch and to an output of the control circuit via a second electronically controllable switch wherein the first and second switches are controlled in a manner such that for boosting the input signal in a frequency band determined by the frequency-dependent voltage divider
the first switch is set to a position such that boosting is effected with the desired frequency bandwidth, and that
the position of the second switch is selected so as to obtain boosting to the desired degree, and that for attenuating the input signal in the frequency band determined by the frequency-dependent voltage divider
the second switch is set to a position such that attenuation is effected with the desired frequency bandwidth, and that
the first switch is set to such a position as to obtain attenuation to the desired degree.

2. A control circuit as claimed in claim 1, wherein for boosting the input signal in the frequency band the first switch is set to a position for minimum negative feedback, and for attenuating the input signal in the frequency band the second switch is set to that position in which the maximal attenuation of the output signal is obtained.

3. A control circuit as claimed in claim 2, wherein the circuit is a part of a plurality of circuit arrangements with electronically controllable transfer characteristic which are coupled in cascade to influence the input signal in different frequency bands.

4. A control circuit as claimed in claim 2 wherein said voltage-divider circuit comprises a resistor chain including said plurality of taps, said control circuit further comprising two series-connected capacitors connected in parallel with the resistor chain, and means connecting a node between the capacitors to ground via a resistor.

5. A control circuit as claimed in claim 2, wherein the switches are semiconductor circuits whose switching states are controlled by digital data words.

6. A control circuit as claimed in claim 1 wherein said voltage-divider circuit comprises a resistor chain including said plurality of taps, said control circuit further comprising two series-connected capacitors connected in parallel with the resistor chain, and means connecting a node between the capacitors to ground via a resistor.

7. A control circuit as claimed in claim 6, wherein the switches are semiconductor circuits whose switching states are controlled by digital data words.

8. A control circuit as claimed in claim 1, wherein the switches comprises semiconductor circuits having switching states controlled by digital data words applied to their respective control inputs, and said first and second switches are controlled so that in at lest one position of the switches neither switch conveys the full output voltage of the amplifier.

9. A control circuit as claimed in claim 1, wherein the circuit is a part of a plurality of circuit arrangements with electronically controllable transfer characteristic which are coupled in cascade to influence the input signal in different frequency bands.

10. A control circuit as claimed in claim 1, wherein said plurality of taps comprise a first end tap directly connected to said output of the amplifier, and wherein said first and second electronically controllable switches are controlled so that they are not simultaneously connected to said first end tap.

11. A control circuit having an electronically controllable frequency transfer characteristic comprising:
an amplifier having first and second inputs and a controllable negative feedback,
a signal input terminal coupled to the first input of the amplifier,
a signal output terminal,
a frequency-dependent voltage divider coupled to an output of the amplifier and having a plurality of taps connectable to the second input of the amplifier via a first controllable switch and to said signal output terminal via a second controllable switch, wherein
the first and second switches are controlled in a manner such that for boosting the input signal in a frequency band determined by the frequency-dependent voltage divider
the first switch is set to a tap position such that boosting is effected with the desired frequency bandwidth, and that
the tap position of the second switch is selected so as to obtain boosting to the desired degree, and that
for attenuating the input signal in the frequency band determined by the frequency-dependent voltage divider
the second switch is set to a tap position such that attenuation is effected with the desired frequency bandwidth, and that
the first switch is set to a tap position so as to obtain attenuation to the desired degree.

12. A control circuit as claimed in claim 11, wherein said first and second controllable switches are controlled so that the output of the amplifier is not directly connected simultaneously to the second input of the amplifier and to the signal output terminal.

13. A control circuit as claimed in claim 11, wherein said first and second controllable switches are controlled so that, to boost the input signal in the frequency band, the first switch is connected to a tap which provides minimum negative feedback, and to attenuate the input signal in the frequency band, the second switch is connected to a tap which produces maximum attenuation of the output signal.

14. A control circuit as claimed in claim 11, wherein said voltage-divider circuit comprises a resistor chain including said plurality of taps, said control circuit further comprising two series-connected capacitors connected in parallel with the resistor chain, and means connecting a node between the capacitors to ground via a resistor.

15. A method of controlling the frequency transfer characteristic of a circuit which comprises an amplifier having a controllable negative feedback and connected to a frequency-dependent voltage-divider circuit which includes plural taps connectable to an input of the amplifier via a first controllable switch and to a circuit output via a second controllable switch, said method comprising:
- in order to boost an amplifier input signal in a frequency band determined by the frequency-dependent voltage divider;
  - controlling the first switch to a tap position at which boosting is effected with a desired frequency bandwidth, and
  - controlling the second switch to a tap position which produces the desired degree of boosting, and
- in order to attenuate the input signal in the frequency band determined by the frequency-dependent voltage divider;
  - controlling the second switch to a tap position at which attenuation is effected with a desired frequency bandwidth, and
  - controlling the first switch to a tap position which produces the desired degree of attenuation.

16. A method as claimed in claim 15 wherein, during the step of controlling the first switch to boost the input signal in the frequency band, the first switch is controlled to a tap position providing minimum negative feedback, and during the step of controlling the second switch to attenuate the input signal in the frequency band, the second switch is controlled to a tap position providing maximum attenuation of an output signal.

* * * * *